United States Patent
Torii et al.

(10) Patent No.: US 6,822,276 B1
(45) Date of Patent: Nov. 23, 2004

(54) MEMORY STRUCTURE WITH A FERROELECTRIC CAPACITOR

(75) Inventors: Kazuyoshi Torii, Hachioji (JP); Hiroshi Miki, Shinjuku-ku (JP); Yoshihisa Fujisaki, Hachioji (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/391,250

(22) Filed: Sep. 7, 1999

(30) Foreign Application Priority Data

Sep. 10, 1998 (JP) .......................................... 10-256287

(51) Int. Cl.⁷ ...................... H01L 27/108; H01L 29/76; H01L 29/94; H01L 31/119
(52) U.S. Cl. ...................... 257/295; 257/303; 257/306
(58) Field of Search ................................ 257/295–310; 438/253–254, 396–399

(56) References Cited

U.S. PATENT DOCUMENTS 5,416,042 A * 5/1995 Beach et al. .................... 438/3
5,418,388 A * 5/1995 Okudaira et al. ........... 257/295
5,478,772 A * 12/1995 Fazan .......................... 438/253
5,838,035 A * 11/1998 Ramesh ....................... 257/295
5,854,104 A * 12/1998 Onishi et al. ................... 438/3
6,043,529 A * 3/2000 Hartner et al. .............. 257/306

FOREIGN PATENT DOCUMENTS

| DE | WO009815013 A1 | * 4/1998 | ....... H01L/21/3205 |
| JP | 2-288368 | 11/1990 | |
| JP | 3-256358 | 11/1991 | |
| JP | 5-090606 | 4/1993 | |
| JP | 7-014993 | 1/1995 | |

* cited by examiner

Primary Examiner—Cuong Nguyen
(74) Attorney, Agent, or Firm—Antonelli, Terry, Stout & Kraus, LLP

(57) ABSTRACT

It is an object of the present invention to provide a fine memory cell structure preventing a reaction between an interlayer insulating film and a ferroelectric film and suitable for high integration. According to the invention, there is provided a structure in which a reaction barrier film 43 is interposed between a ferroelectric film 71 and an interlayer insulating film 32 and side walls of a diffusion barrier film 51 are not brought into direct contact with the ferroelectric film 71. Thereby, the reaction between the interlayer insulating film 32 and the ferroelectric film 71 can be restrained and exfoliation of the ferroelectric film 71 can be prevented.

26 Claims, 15 Drawing Sheets

MEMORY STRUCTURE WITH A FERROELECTRIC CAPACITOR

BACKGROUND OF THE INVENTION

1. Field of the Invention

The present invention relates to a semiconductor device of an element using a ferroelectric thin film, particularly to a polarization inversion type non-volatile memory or a dynamic random access memory preferable to a large scale integrated circuit (LSI) and its fabrication method.

2. Description of the Prior Art

There are ferroelectric substances having an extremely large relative dielectric constant ranging from several hundreds to several thousands. Therefore, when a thin film made of these ferroelectric substances is used in a capacitor insulating film, there is provided a capacitor having a small area and a large capacitance preferable to a large scale integrated circuit (LSI). Further, a ferroelectric substance is provided with capacitor dielectric and its direction can be inverted by an outside electric field and accordingly, there is provided a non-volatile memory by using the characteristic.

There is disclosed a memory using a conventional ferroelectric substance in, for example, JP-A-5-90606. As shown by FIG. 22, a ferroelectric capacitor is formed by forming successively a lower Pt electrode 225, a ferroelectric thin film 226, an upper Pt electrode 227 and a Ti electrode 228 above an interlayer insulating film 224. Further, in the drawing, numeral 221 designates an isolation insulating film, numeral 222 designates a word line, numeral 223 designates an impurity diffused layer and numeral 229 designates an aluminum wiring layer. However, according to the technology, the respective layers are fabricated by independent masks and accordingly, there poses a problem of dimensional accuracy and matching accuracy. Hence, there has been proposed a structure disclosed in JP-A-2-288368. That is, as shown by FIG. 23, this is a method of subjecting an upper electrode layer 238, a ferroelectric film 237 and a lower electrode layer 236 summarizingly to dry etching. However, by the summarizing fabrication, leakage current is increased. Hence, there is a method disclosed in JP-A-3-256358 in which as shown by FIG. 24, only a lower electrode is fabricated and a ferroelectric film and an upper electrode are not fabricated for each cell but fabricated as a large pattern at an outer side of a memory mat or the like to thereby realize a highly integrated memory having a structure dispensing with matching allowance.

In the meantime, FIG. 25 shows a structure of another conventional memory cell disclosed in JP-A-7-14993. Although according to the structure, only a lower electrode is finely fabricated and a ferroelectric film and an upper electrode are not fabricated for each cell, there is a feature in that an adhesion layer 251 is interposed between an interlayer insulating film and a capacitor insulating film. It is described that as the adhesion layer, a layer of $TiO_2$, $ZrO_2$, $Ta_2O_5$, $Si_3N_4$ or the like is effective.

Further, as another conventional memory cell structure, there has been proposed a structure disclosed in JP-A-7-169854 in which as shown by FIG. 26, a lower electrode and a diffusion barrier layer are embedded in a reaction barrier film. This structure is obtained by the following process. First, an interlayer insulating film 248 and a polycrystal silicon film 246 are formed, thereafter, a titanium film 261 is formed, successively, a diffusion barrier layer 249 and a lower electrode 251 are formed. Thereafter, a ferroelectric film 252 is formed. In piling up the ferroelectric film 252, the titanium film is oxidized and the $TiO_2$ film 261 of a reaction barrier layer is formed.

SUMMARY OF THE INVENTION

When lead zirconate titanate (PZT) is used in a capacitor insulating film in the above-described method disclosed in JP-A-3-256358, according to an investigation of the inventors, at a portion where PZT and a silicon oxide film which is an interlayer insulating film are brought into direct contact with each other, a reaction is caused therebetween. The reaction is caused even at low temperature of about 500° C. and particularly when PZT is formed at temperatures equal to or higher than 700° C., the silicon oxide layer completely reacts with PZT and a melted state is brought about. It becomes apparent that this phenomenon is caused by lead which is a major constituent element of PZT.

Further, in respect of the above-described method disclosed in JP-A-7-14993, according to an investigation of the inventors, it has been found that although $Si_3N_4$, in the adhesion layer reacts with PZT similar to the silicon oxide film, when $TiO_2$, $ZrO_2$, $Ta_2O_5$ is used for the adhesion layer, the adhesion layer serves as a reaction barrier layer between PZT and the silicon oxide film and therefore, the above-described problem of reaction between PZT and the silicon oxide film can be resolved. However, according to the structure, it has been clearly found that since side faces of a diffusion barrier layer 249 disposed below a lower electrode is exposed, when the PZT film is formed by CVD process or the like necessitating a heated oxidizing Ad atmosphere in the film forming operation, there poses a problem in which the diffusion barrier layer 249 is oxidized and the film is exfoliated. It has been found that even in the case of using sol-gel process, sputtering process, vapor deposition process or the like, there poses a similar problem in which in carrying out heat treatment of crystallization, the diffusion barrier layer 249 is oxidized. It seems that although a metal nitride of TiN, (Ti, Al)N, WN or the like is widely used in the diffusion barrier layer 249 and when the metal nitride is oxidized, nitrogen is discharged and therefore, exfoliation of the film formed thereon becomes significant.

In the meantime, according to the method disclosed in JP-A-7-169854, when Ti is oxidized, the volume is expanded and exfoliation of the ferroelectric film is brought about.

It is an object of the present invention to achieve a semiconductor device preventing reaction between a ferroelectric film and an insulating film and preventing film exfoliation and its fabrication method.

The above-described object is achieved by constituting a semiconductor device in which a reaction barrier film is provided between a ferroelectric film and an interlayer insulating film, side faces of the diffusion 2II barrier film and the ferroelectric film are not brought into contact with each other and side walls of a lower electrode and the ferroelectric film are brought into contact with each other.

By constructing the above-described constitution, in the case in which, for example, $TiO_2$ is used for the reaction barrier film, when the film thickness is equal to or larger than 2 nm, it is effective in preventing a reaction between a silicon-species interlayer insulating film and lead included in a capacitor insulating film even in rapid heat treatment at about 700° C. which is needed in crystallizing a PZT film. Further, only the diffusion barrier film is embedded into the reaction barrier film and therefore, the side walls of the lower electrode can be utilized as a capacitor, which is particularly effective in the case of applying to DRAM.

Further, the above-described object is achieved by embedding the diffusion barrier film in the interlayer insulating film as plugs and interposing the reaction barrier film between the capacitor insulating film and the interlayer insulating film. Also in this structure, a lower electrode is formed on the plug and accordingly, a ferroelectric film is installed from a side face to an upper face of the lower electrode, the side walls of the lower electrode can also be utilized as capacitor, which is particularly effective in the case of applying to DRAM.

Further, the above-described object is achieved by forming the reaction barrier film functioning to prevent reaction on the interlayer insulating film and thereafter forming the diffusion barrier film and the ferroelectric film. Before forming the diffusion barrier film and the ferroelectric film, the reaction barrier film is formed previously as an oxide and therefore, even when the reaction barrier film per se is formed by oxidizing a metal film, there poses no problem of exfoliation by volume expansion or the like.

Although there has been described of the case in which PZT is used for the capacitor insulating film, similar effect is observed even in the case of using lead-species ferroelectric substance other than PZT or Bi-species lamellar ferroelectric substance such as $Bi_4Ti_3O_{12}$, $Sr_2Bi_2Ta_5O_9$ or the like. According to the Bi-species lamellar ferroelectric substance, generally, mutual diffusion with an interlayer insulating film becomes significant by an amount of the crystallizing temperature higher than that of the Pb-species ferroelectric substance and accordingly, the reaction barrier film becomes further necessary.

Further, it has been considered conventionally that in the case of dielectric substance which does not include lead or bismuth, for example, strontium barium titanate (BST), the reaction with the silicon oxide film constituting the matrix of the lower electrode is not significant and poses no serious problem. However, according to an investigation by the inventors, it has been found that although the diffusion coefficient is smaller than that of Pb or Bi, Ba or Sr also diffuses into the $SiO_2$ matrix. Therefore, it is found that the significance of installing the reaction barrier film is great even in the case of using a film of BST-species.

The foregoing and other object, advantages, manner of operation and novel features of the present invention will be understood from the following detailed description when read in connection with the accompanying drawings.

DESCRIPTION OF THE PREFERRED EMBODIMENTS (First Embodiment)

Figure 1:
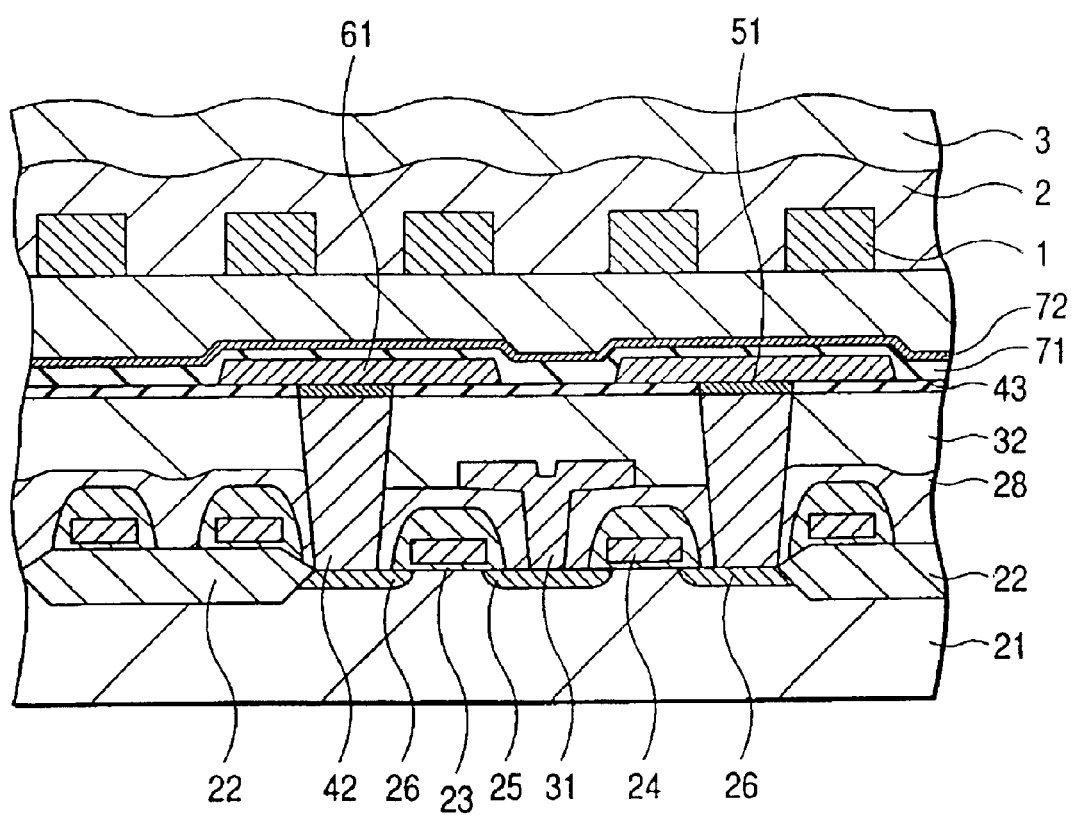
FIG. 1 is a sectional view of a semiconductor device according to First Embodiment of the present invention.

An explanation will be given of a preferred embodiment of the present invention in reference to FIG. 1. According to a condenser of the present invention, a diffusion barrier layer 43 formed by a publicly-known method is embedded in a reaction barrier layer 44 above an element layer including transistors formed by a publicly-known method. Above these, a lower electrode is formed and fabricated in a desired shape, thereafter, a ferroelectric thin film 71 including lead and an upper electrode 72 are formed.

According to the structure, the ferroelectric thin film 71 and the upper electrode 72 are not separated into patterns in correspondence with respective memory cells but are continuously present over a plurality of memory cells. In respect of the two layers, only minimum fabrication necessary for operating a storage device (for example, a portion for separating a memory cell region from other region) is carried out and the request to fabrication accuracy is considerably alleviated.

Further, the diffusion barrier layer 51 is embedded in the reaction barrier layer 43 and is not oxidized in crystallization heat treatment of the ferroelectric thin film 71.

Figure 2:
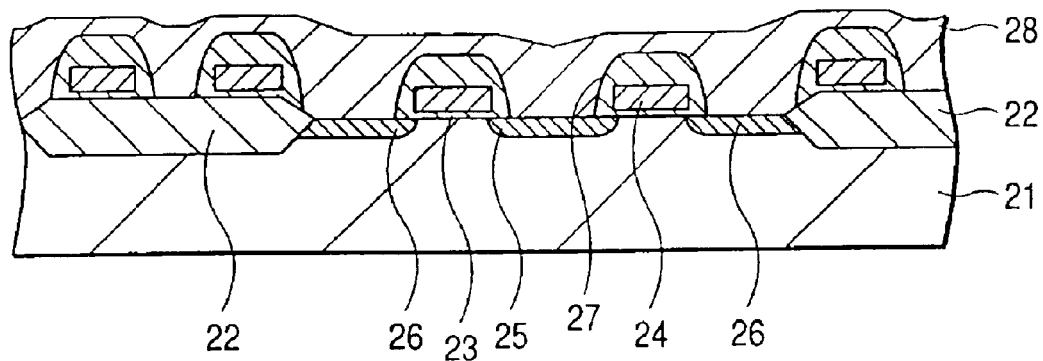
FIG. 2 is a first sectional view showing a fabrication step of a memory cell using the present invention.

FIG. 2 through FIG. 6 show an embodiment of fabricating a memory cell by using the present invention. First, as shown by FIG. 2, a switch transistor is formed by a conventional step of forming MOSFET. n-type impurity (phosphor) diffusion layers 25 and 26 are formed in a p-type semiconductor substrate 21 and inter-element isolation oxide films 22, a gate oxide film 23, a word line 24 and an insulating film 27 are formed. Successively, an $SiO_2$ layer 28 having a thickness of 600 nm is piled up by a CVD process over an entire surface by using a publicly-known CVD process, reflowed at 850° C. and thereafter etched back by 300 nm to thereby alleviate a stepped difference caused by the word line.

Figure 3:
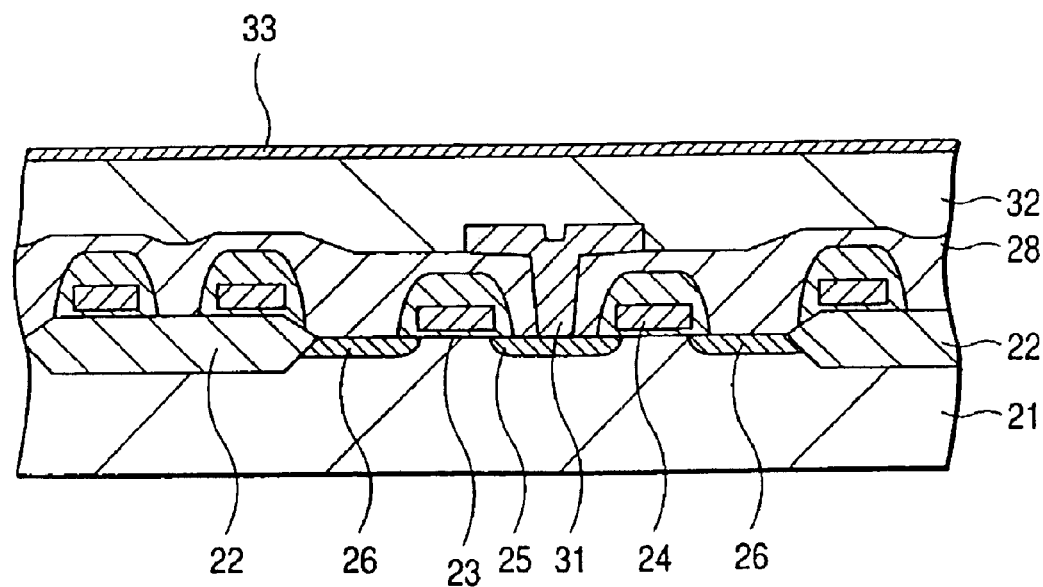
FIG. 3 is a second sectional view showing a step of First Embodiment according to the present invention.

Next, a portion 25 where a bit line is brought into contact with the n-type diffusion layer at the surface of the substrate is opened by using publicly-known photolithography process and dry etching process (FIG. 3). Next, a bit line 31 is formed. As material of the bit line, a laminated layer film of silicide of metal and polycrystal silicon is used. Fabrication is carried out by using publicly-known photolithography process and dry etching process to thereby constitute the bit line in a desired pattern. Next, an insulating film 32 of silicon oxide film-species such as BPSG is piled up and flattened. The insulating film 32 needs to be provided with a film thickness sufficient for flattening the substrate surface. According to the embodiment, the film thickness of the insulating film 32 is determined to be 600 nm and there is used a method of flattening by publicly-known chemical and mechanical polishing process. Next, a reaction barrier layer 33 is formed on the interlayer insulating film. In forming the reaction barrier layer, there have been tried a method of piling up a $TiO_2$ film by 50 nm by a reactive sputtering method and a method of piling up a Ti film and thereafter oxidizing Ti by heat treatment at 750° C. for 30 minutes in an oxygen atmosphere and an excellent result is obtained by both of them.

Figure 4:
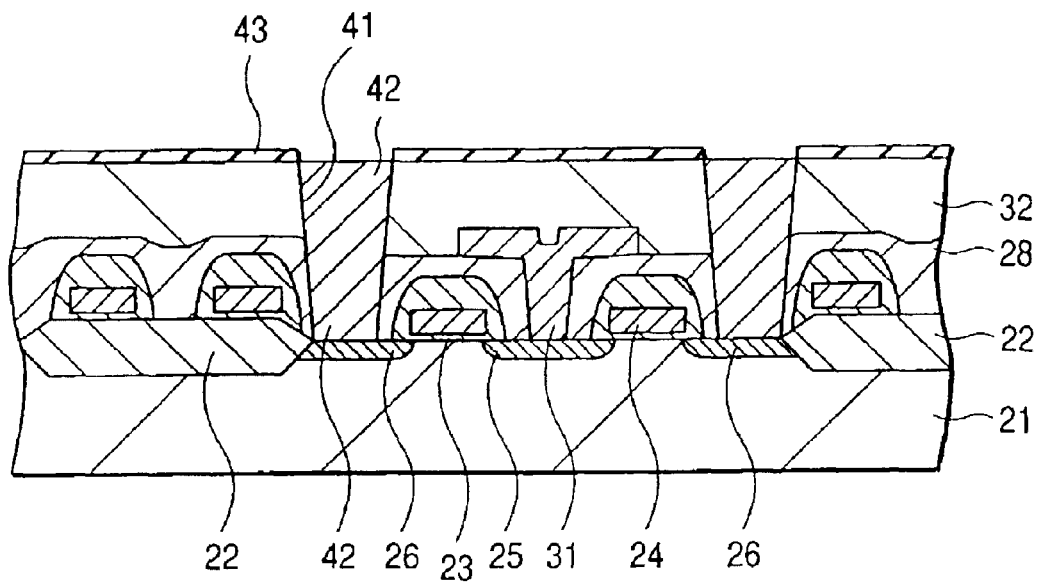
FIG. 4 is a third sectional view showing a step of First Embodiment according to the present invention.
Figure 5:
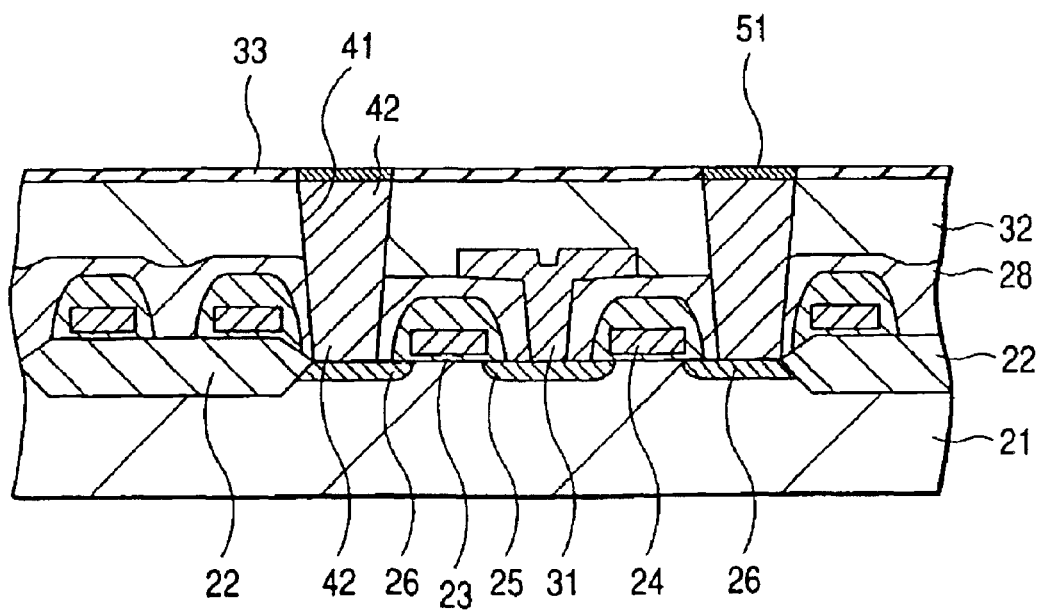
FIG. 5 is a fourth sectional view showing a step of First Embodiment according to the present invention.
Figure 6:
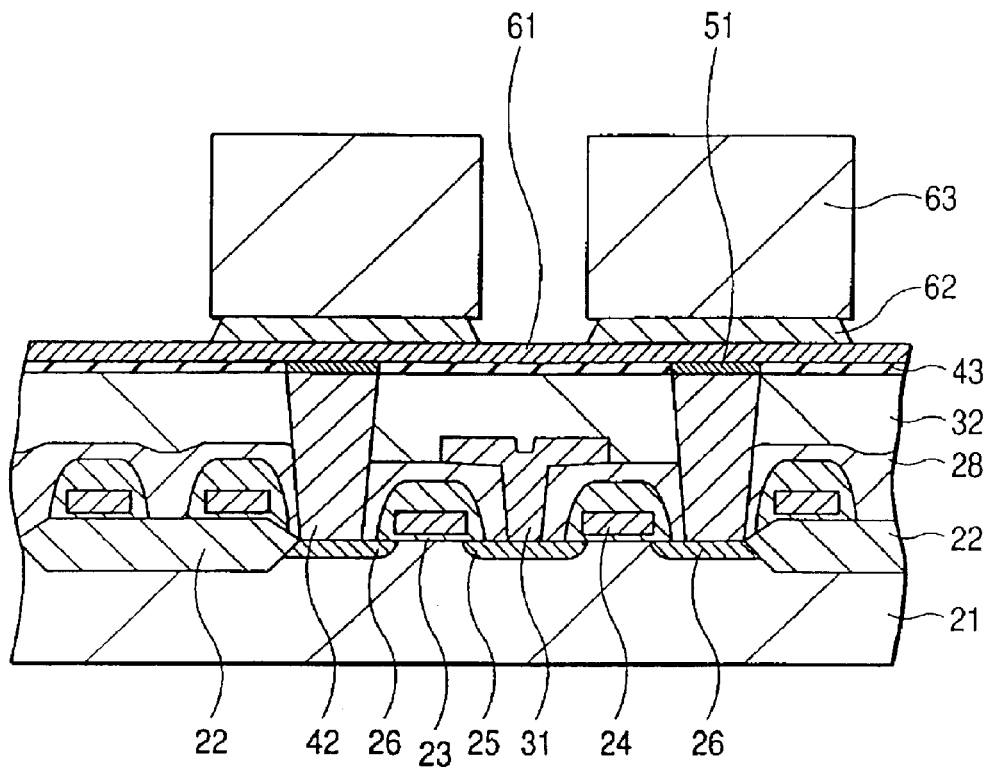
FIG. 6 is a fifth sectional view showing a step of First Embodiment according to the present invention.

Next, as shown by FIG. 4, by using publicly-known photolithography process and dry etching process, a memory contact hole 41 by which a store capacity portion is brought into contact with the substrate is opened. A polycrystal silicon layer 42 is deposited by 350 nm on the insulating film 32 and the inner side of the contact hole by using a CVD process. Next, the polycrystal silicon layer 42 is etched back by an amount of the film thickness by using a dry etching process to thereby fill the contact hole. Further, overetching in correspondence with a film thickness of 50 nm is added and there is constructed a structure in which the surface of the polycrystal silicon layer sinks into the hole. Next, a TiN layer having a thickness of 100 nm is formed by using a sputtering process as a diffusion barrier layer 51 and flattened by a CMP process to thereby embed the TiN layer in the contact hole. In this way, the embedded diffusion barrier layer of FIG. 5 is formed.

Next, a Pt film 61 having a thickness of 100 nm is coated as a matrix electrode 61 by a sputtering process (FIG. 6), successively, a tungsten layer 62 having a thickness of 100 nm is coated as a mask for fabricating the Pt layer. A pattern is transcribed on the tungsten layer 62 by a dry etching process using $SF_6$ with a photoresist 63 as a mask. After removing the photoresist 63, the lower electrode 61 is patterned by a sputter etching process using the tungsten layer 62 as the mask.

Figure 7:
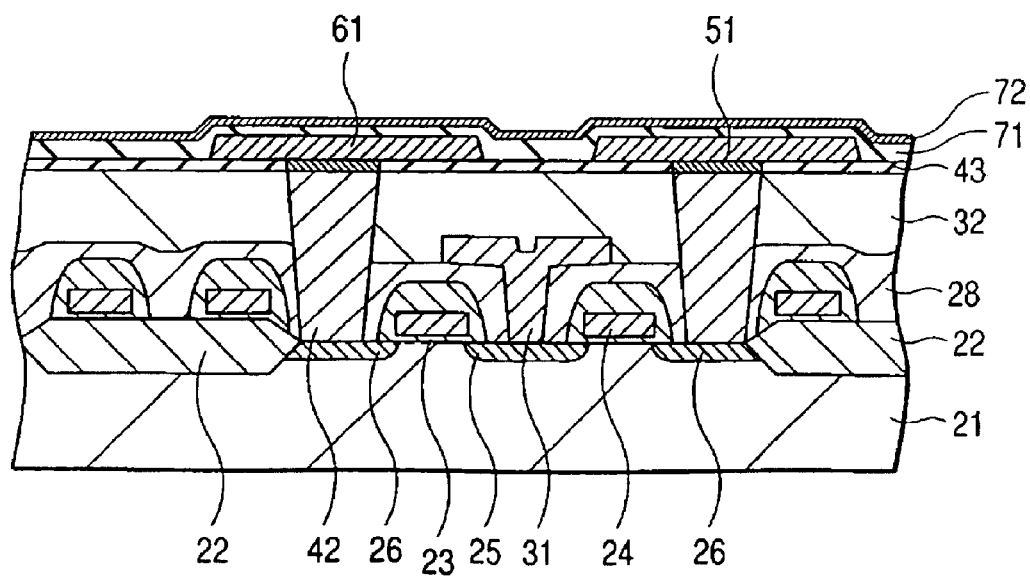
FIG. 7 is a sixth sectional view showing a step of First Embodiment according to the present invention.

After removing the tungsten mask, a ferroelectric thin film 71 is formed (FIG. 7). According to the embodiment, by a reactive evaporation process, a thin film of lead titanate zirconate $(Pb(Zr_{0.5}Ti_{0.5})O_3)$ having a thickness of about 100 nm is formed and thereafter subjected to heat treatment at 650° C. for 30 seconds to thereby crystallize the film. In forming the ferroelectric thin film, a reactive sputtering method or a CVD process may also be used. Next, a Pt film 72 having a thickness of 50 is coated as an upper electrode by a sputtering process. Thereafter, an interlayer insulating film and wirings are provided to thereby complete the memory cell of FIG. 1.

(Second Embodiment)

Figure 8:
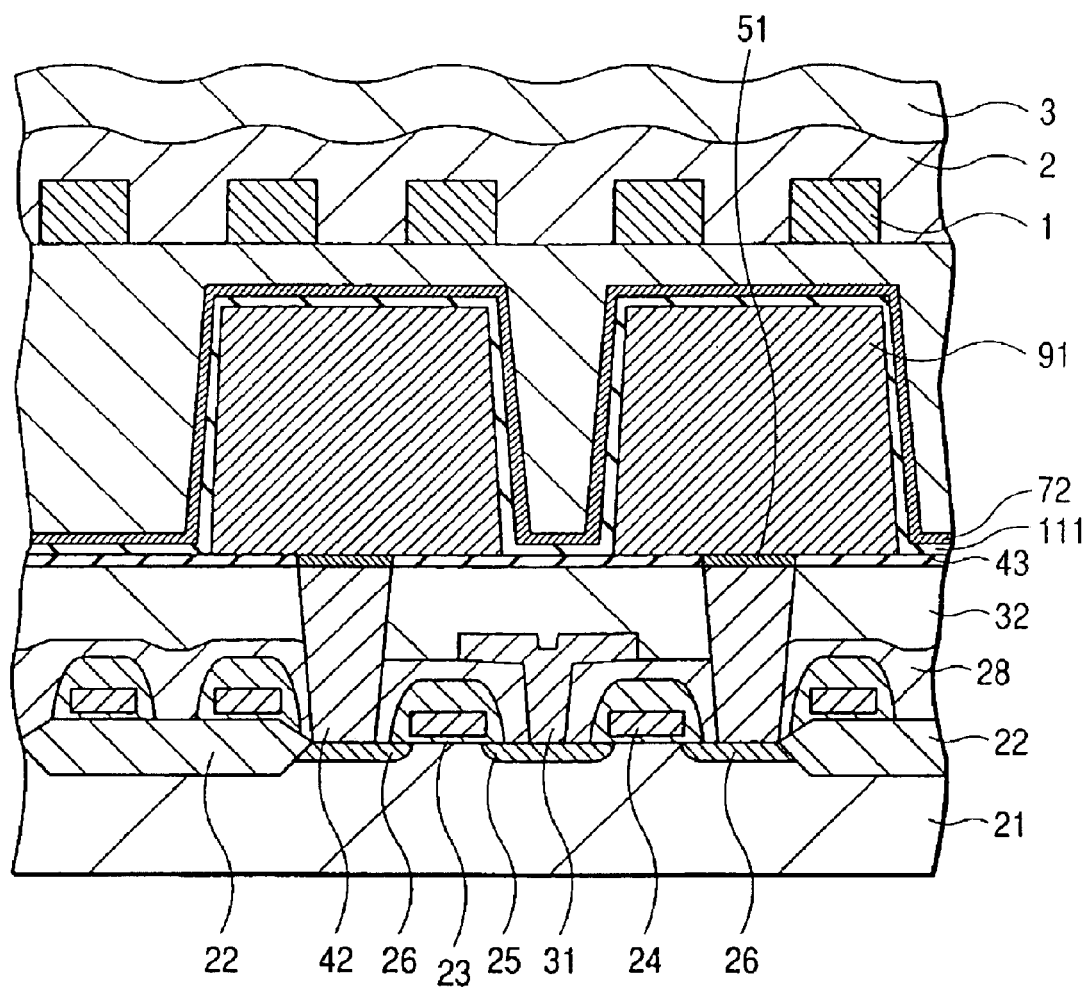
FIG. 8 is a sectional view of a semiconductor device according to Second Embodiment of the present invention.

FIG. 8 shows an embodiment when the present invention is used in DRAM. According to the embodiment, a capacitor lower electrode is thickened and its side walls are utilized to thereby increase the electrostatic capacitance of the capacitor.

An explanation will be given of a method of fabricating a memory cell by using the present invention, in reference to FIG. 9 through FIG. 11. Fabrication steps up to forming the embedded diffusion barrier layer as shown by FIG. 5 are the same as those in First Embodiment.

Figure 9:
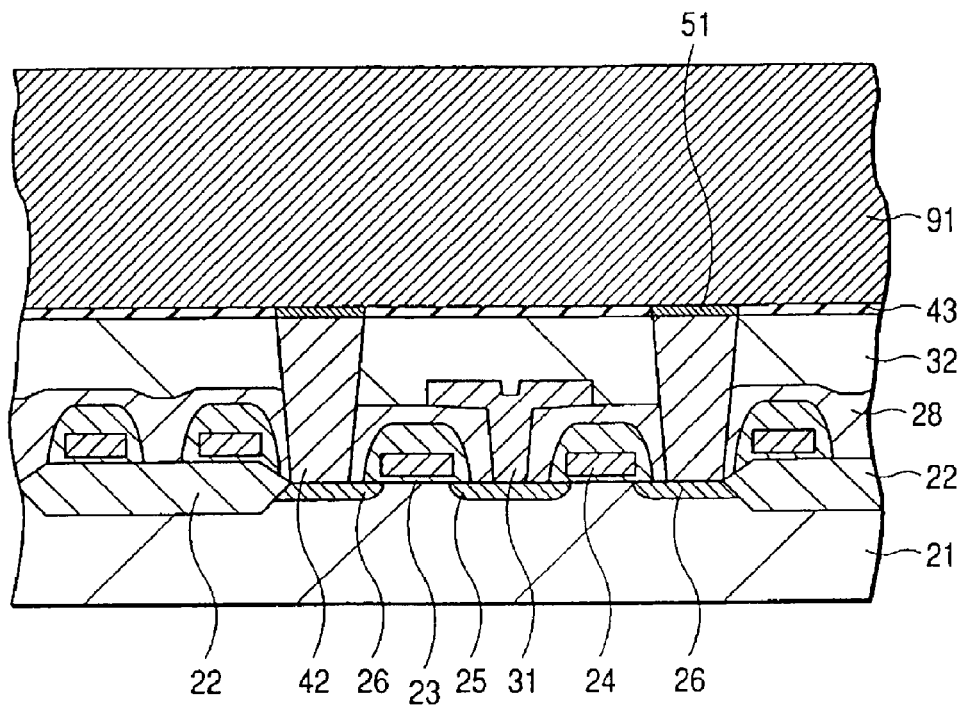
FIG. 9 is a first sectional view showing a fabrication step of a memory cell according to Second Embodiment using the present invention.
Figure 10:
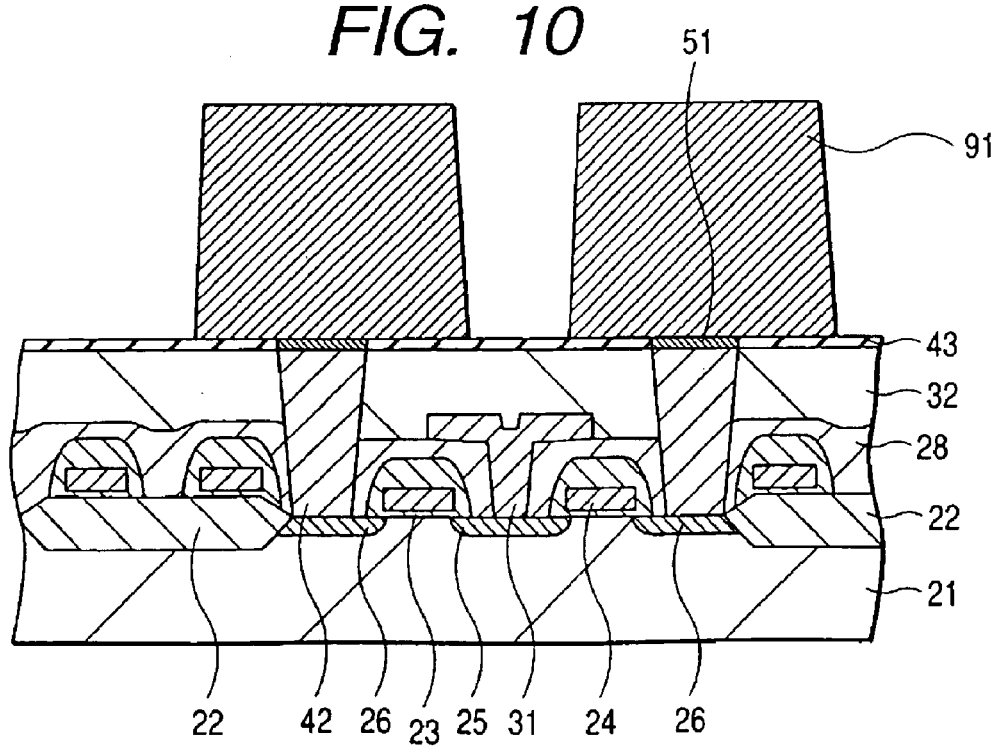
FIG. 10 is a second sectional view showing a step of Second Embodiment of the present invention.

As shown by FIG. 9, a matrix electrode 91 is formed by a sputtering process. According to the embodiment, as the matrix electrode, an Ru film having a thickness of 400 nm is used. The lower electrode 91 is fabricated by a dry etching process by using an $SiO_2$ layer as a mask and the $SiO_2$ mask is removed to thereby provide a structure shown by FIG. 10.

Figure 11:
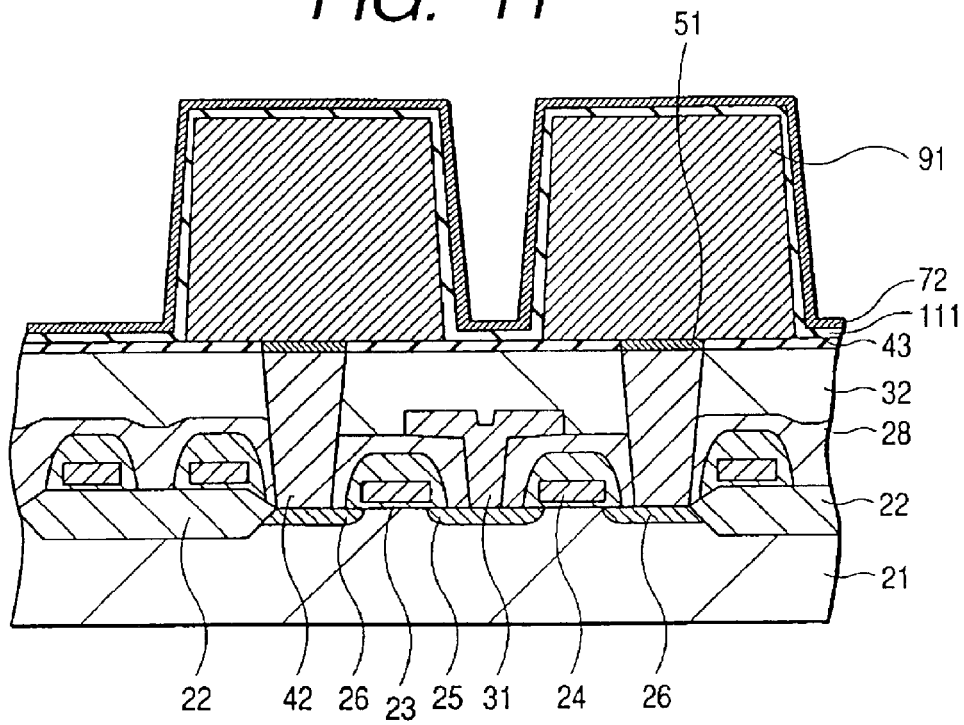
FIG. 11 is a third sectional view showing a step of Second Embodiment of the present invention.

Next, a BST film 111 is piled up by 30 nm by using an MOCVD process as shown by FIG. 11. Thereafter, an upper in electrode is formed and wirings are provided to thereby complete the memory cell of FIG. 8.

(Third Embodiment)

Next, an explanation will be given of an embodiment of the present invention in which matching allowance between a lower electrode and a contact plug is dispensed with and a fine memory cell suitable for high integration can be realized by self-adjustingly forming a reaction barrier layer to the lower electrode of a capacitor in reference to FIG. 15 through FIG. 21.

Figure 15:
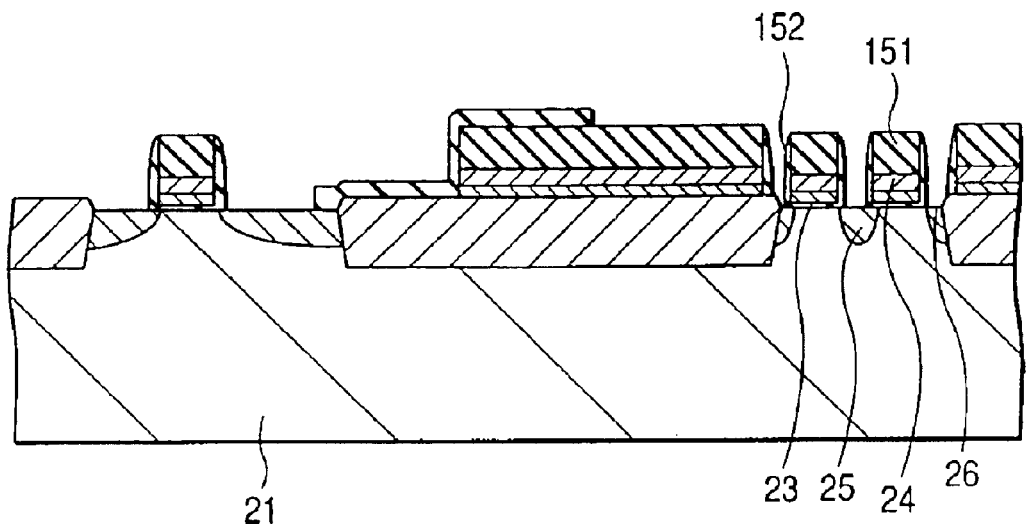
FIG. 15 is a first sectional view showing a fabrication step of a memory cell according to Third Embodiment using the present invention.

First, as shown by FIG. 15, the inter-element isolation insulating film 22 and the gate oxide film 23 are formed on the p-type semiconductor substrate 21. A polycrystal silicon layer having a thickness of 60 nm and the bit line 24 comprising tungsten silicide having a thickness of 60 nm and an $Si_3N_4$ layer 151 having a thickness of 200 nm are successively piled up and fabricated by using publicly-known photolithography process and dry etching process to thereby constitute a desired pattern of a word line for forming a gate electrode. The n-type impurity(phosphor) diffusion layers 25 and 26 are formed by ion implantation with the word line as a mask. An $Si_3N_4$ layer having a thickness of 80 nm is coated by a CVD process and fabricated by an anisotropic etching method to thereby form insulating film layers 152 at side walls of the word line.

Figure 16:
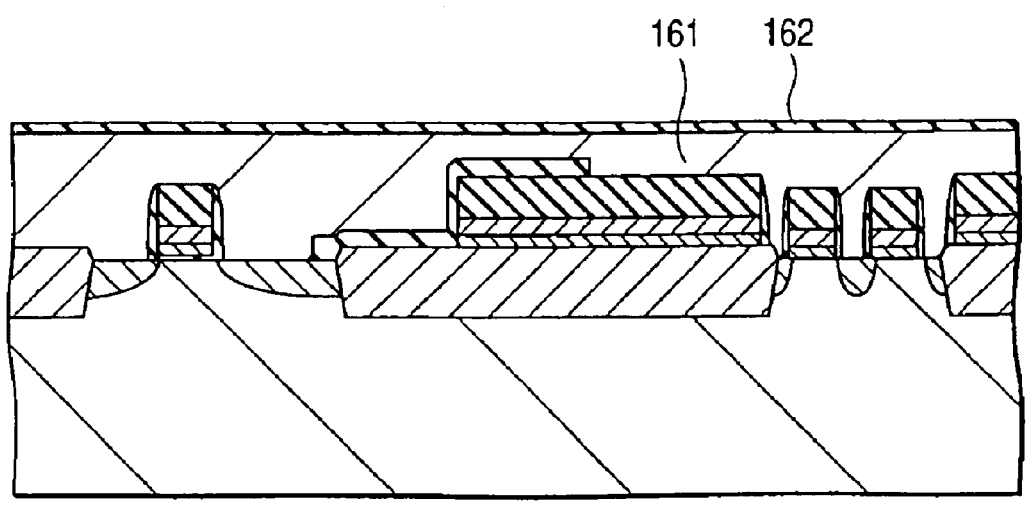
FIG. 16 is a second sectional view showing a fabrication step of a memory cell according to Third Embodiment using the present invention.

Next, as shown by FIG. 16, an $SiO_2$ layer 161 having a thickness of 300 nm is piled up by using a publicly-known CVD process and thereafter flattened by a Cmp process. Next, an $Si_3N_4$ layer 162 having a thickness of 40 nm is piled up by using a publicly-known CVD process.

Figure 17:
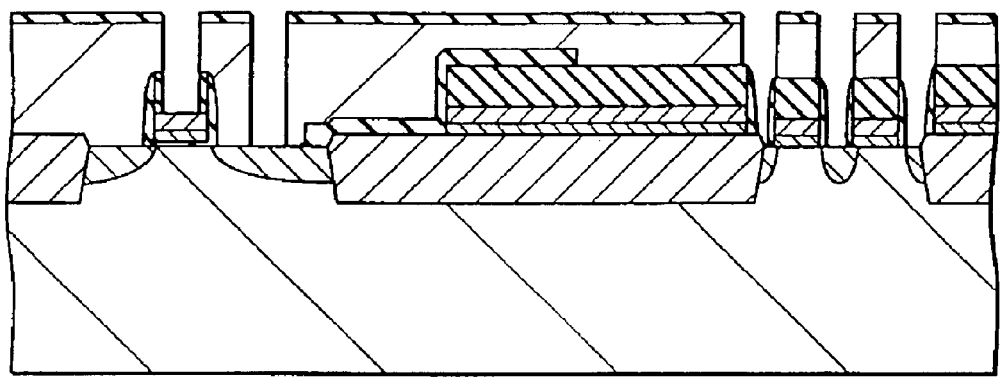
FIG. 17 is a third sectional view showing a fabrication step of a memory cell according to Third Embodiment using the present invention.
Figure 18:
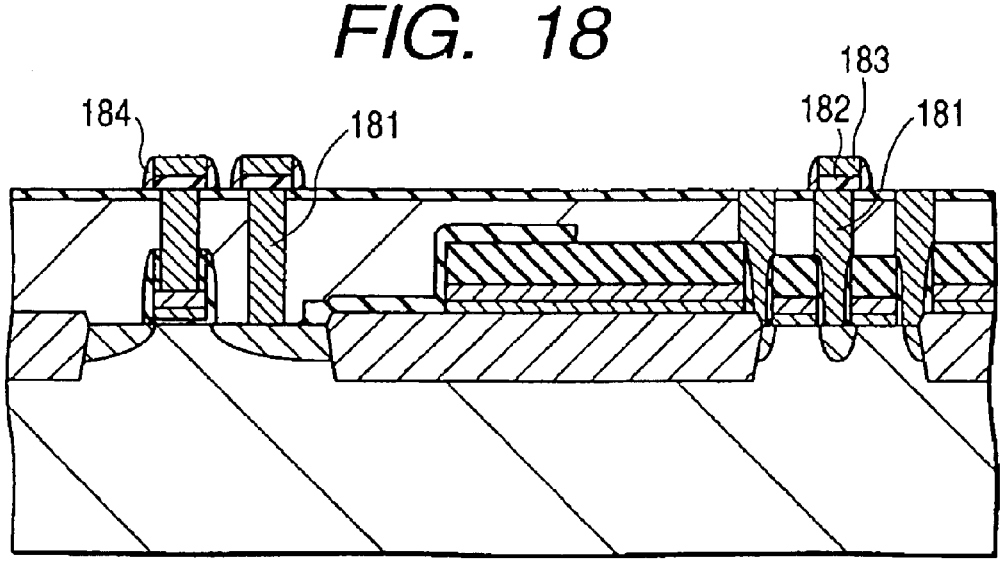
FIG. 18 is a fourth sectional view showing a fabrication step of a memory cell according to Third Embodiment using the present invention.

By using publicly-known photolithography process and dry etching process, there are perforated contact holes from the portion 25 where the bit line is brought into contact with the n-type diffusion layer at the surface of the substrate and the portion 26 where the store electrode is brought into contact with the n-type diffusion layer at the surface of the substrate leading to a peripheral circuit (FIG. 17). By a CVD process, a TiN layer having a thickness of 100 nm is piled up and TIN layers 181 are embedded into the contact holes by a CMP process. Next, a first wiring layer is formed as shown by FIG. 18. As material, a laminated layer film 182 of W/TiN/Ti is used. The laminated film of W/TiN/Ti is piled up by a sputtering process, an $SiO_2$ layer 183 having a thickness of 50 nm is piled up thereon and thereafter, fabricated by using publicly-known photolithography process and dry etching process to thereby constitute the first wiring layer in a desired pattern. The first wiring layer is used for wiring the bit line and a peripheral circuit. An $SiO_2$ layer having a film thickness of 50 nm is piled up by a CVD process and etched back by a dry etching process and side wall spacers 184 are formed at side wall portions of the first wiring layer to thereby insulate the first wiring layer.

Next, an insulating film 191 of silicon oxide film-species such as BPSG is piled up and flattened. According to the embodiment, the film thickness of the insulating film 191 is determined to be 250 nm and the insulating film 191 is flattened by a CMP process. By using publicly-known photolithography process and dry etching process, there is perforated a memory portion contact hole for connecting a store capacitance portion and a diffusion layer. At the same time, there are perforated contact holes for connecting the first wiring layer and a second wiring layer. A TiN layer having a thickness of 100 nm is piled up by a CVD process and a TiN layer 192 is embedded into the contact holes by a CMP process.

Figure 19:
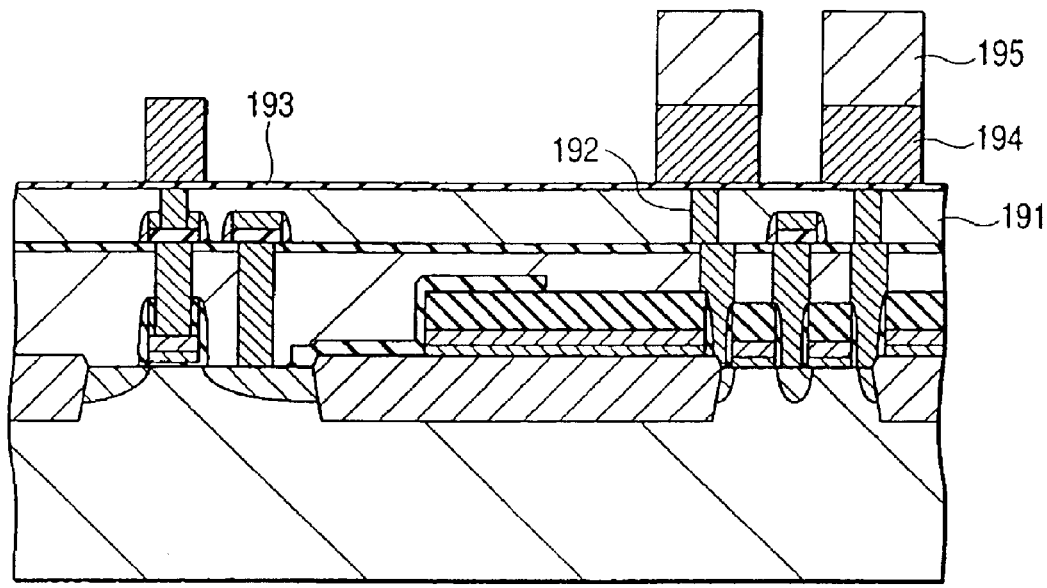
FIG. 19 is a fifth sectional view showing a fabrication step of a memory cell according to Third Embodiment using the present invention.
Figure 20:
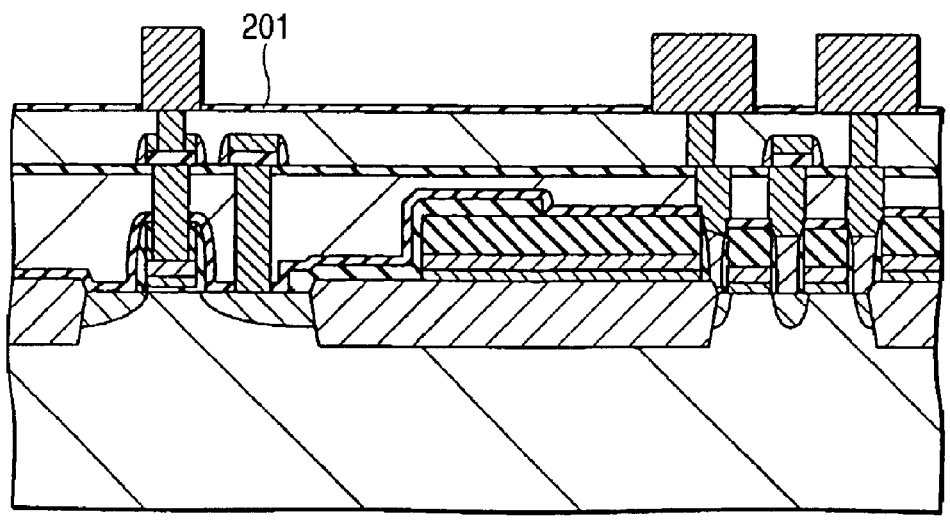
FIG. 20 is a sixth sectional view showing a fabrication step of a memory cell according to Third Embodiment using the present invention.

Next, as shown by FIG. 19, a Ti film 193 having a film thickness of 2 nm and a Pt film 194 having a film thickness of 300 nm are successively piled up by a sputtering process, successively, a tungsten layer 195 is piled up by 300 nm. By a dry etching process using a $SF_6$ with a photoresist as a mask, a pattern is transcribed on the tungsten layer 195. After removing the photoresist, a structure shown by FIG. 20 is provided by fabricating the lower electrode 194 by a sputter etching process using the tungsten layer as a mask. By adding oxygen to Ar in sputter etching, the selectivity between Pt and Ti can sufficiently be promoted. After the etching operation, by rapid heat treatment at 700° C. for 5 seconds in an oxygen atmosphere, the Ti film 193 disposed below the Pt film 194 forms an alloy with Pt and is vanished. Further, a reaction barrier film 211 is self-adjustingly formed only on the interlayer insulating film 191 exposed at a surrounding of the lower electrode.

Figure 21:
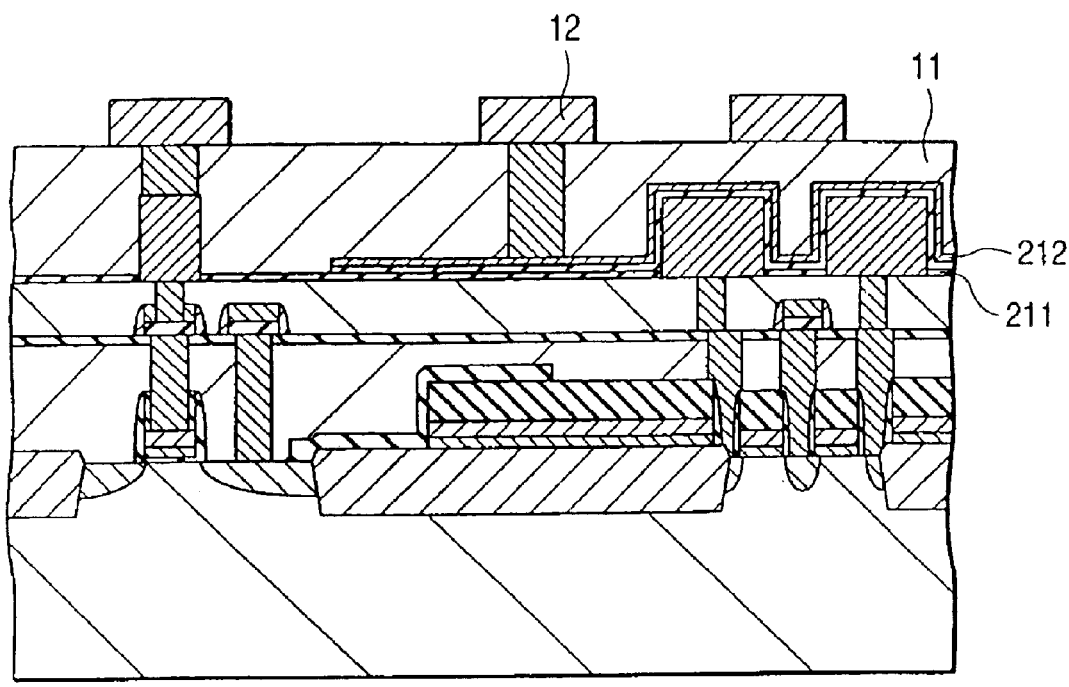
FIG. 21 is a sectional view of a semiconductor device according to Third Embodiment of the present invention.
Figure 22:
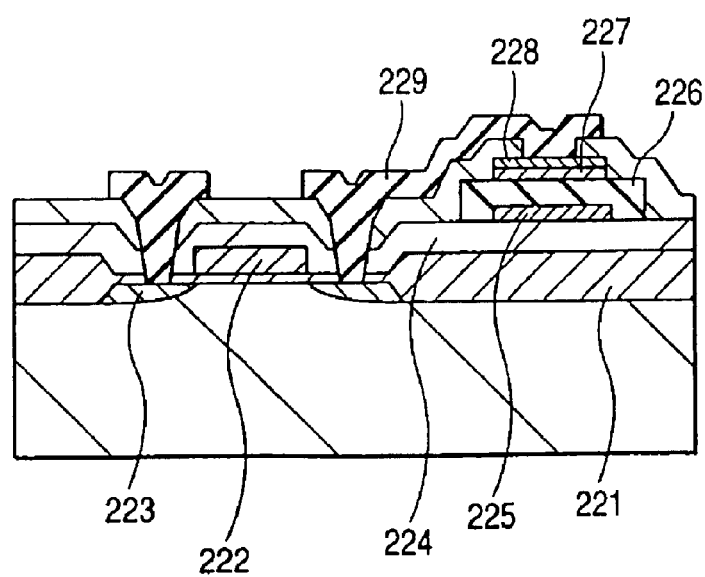
FIG. 22 is a sectional view of a semiconductor device according to a conventional technology.
Figure 23:
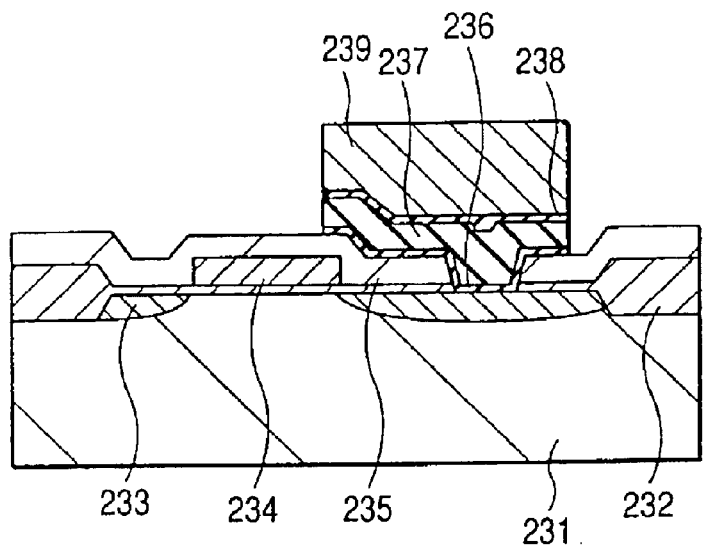
FIG. 23 is a sectional view of a semiconductor device according to a conventional technology.
Figure 24:
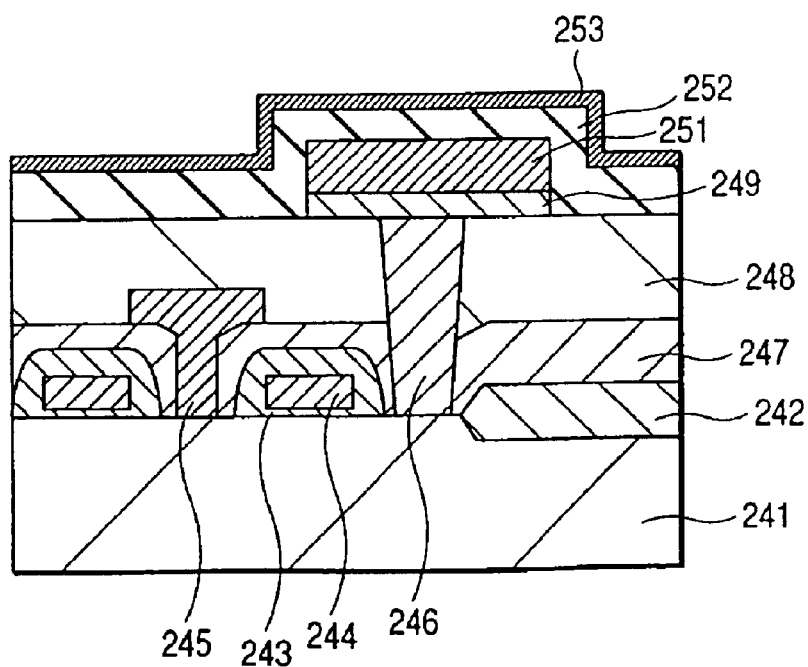
FIG. 24 is a sectional view of a semiconductor device according to a conventional technology.
Figure 25:
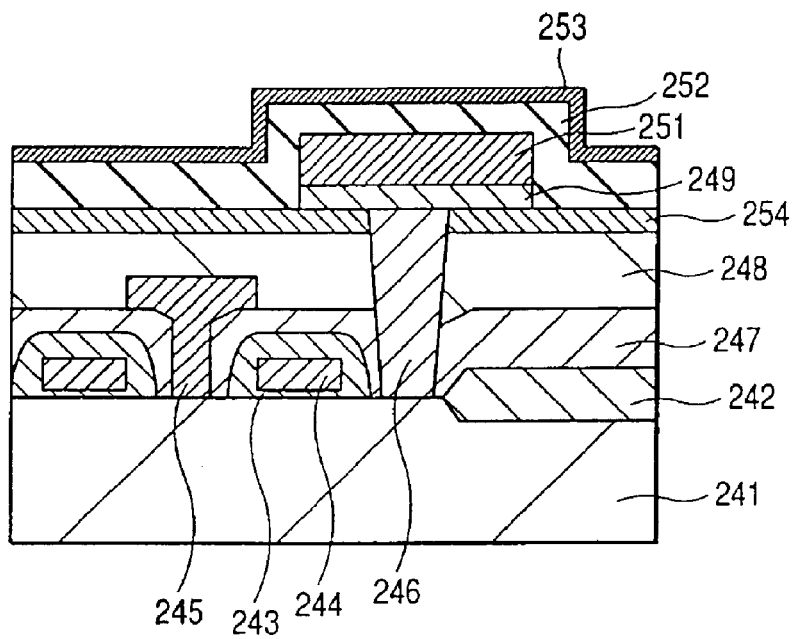
FIG. 25 is a sectional view of a semiconductor device according to a conventional technology.
Figure 26:
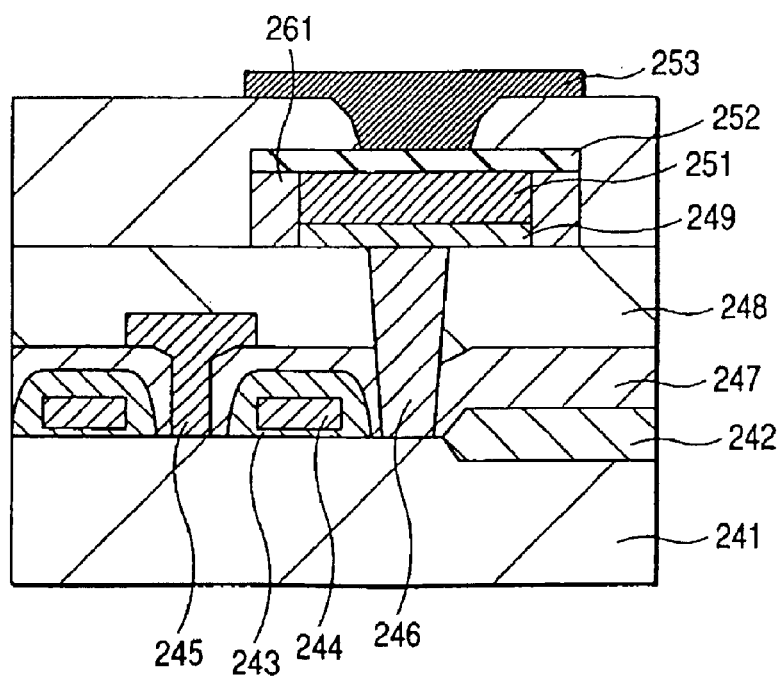
FIG. 26 is a sectional view of a semiconductor device according to a conventional technology.

Next, as shown by FIG. 21, a strontium barium titanate layer 211 having a thickness of 20 nm and a ruthenium dioxide layer 212 having a thickness of 20 nm are successively piled up by an MOCVD process. The ruthenium dioxide layer and the strontium barium titanate layer at the portions where the plate electrode is not necessary outside of a memory mat, are removed with a photoresist as a mask and thereafter, wiring is carried out to thereby complete a memory cell. Although according to the embodiment, Pt is used as material of the lower electrode, Ru or Ir may naturally be used.

(Fourth Embodiment)

Figure 12:
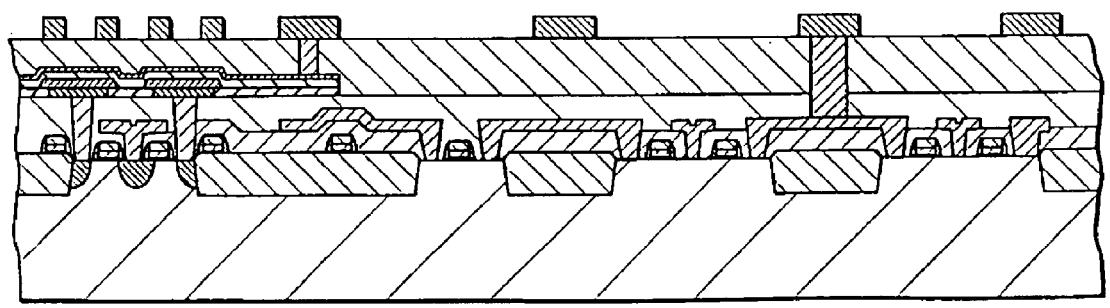
FIG. 12 is a sectional view of essential portions of respective portions of a memory cell array portion and a peripheral circuit contiguous thereto according to the present invention.
Figure 13:
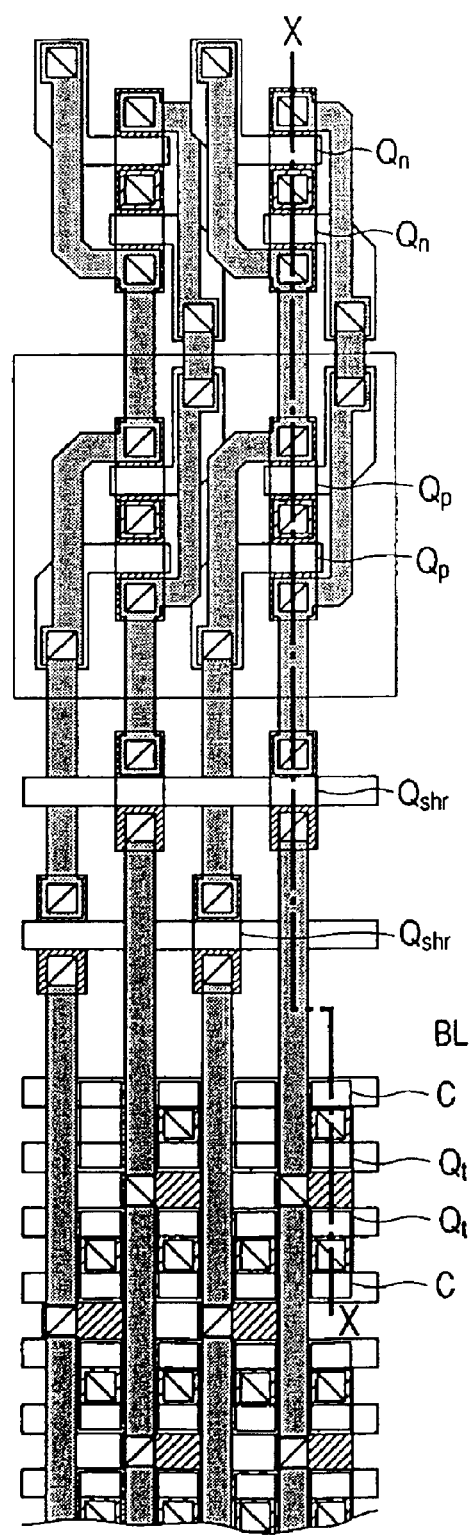
FIG. 13 is a plane view of respective portions of the memory cell and the peripheral circuit according to the present invention.
Figure 14:
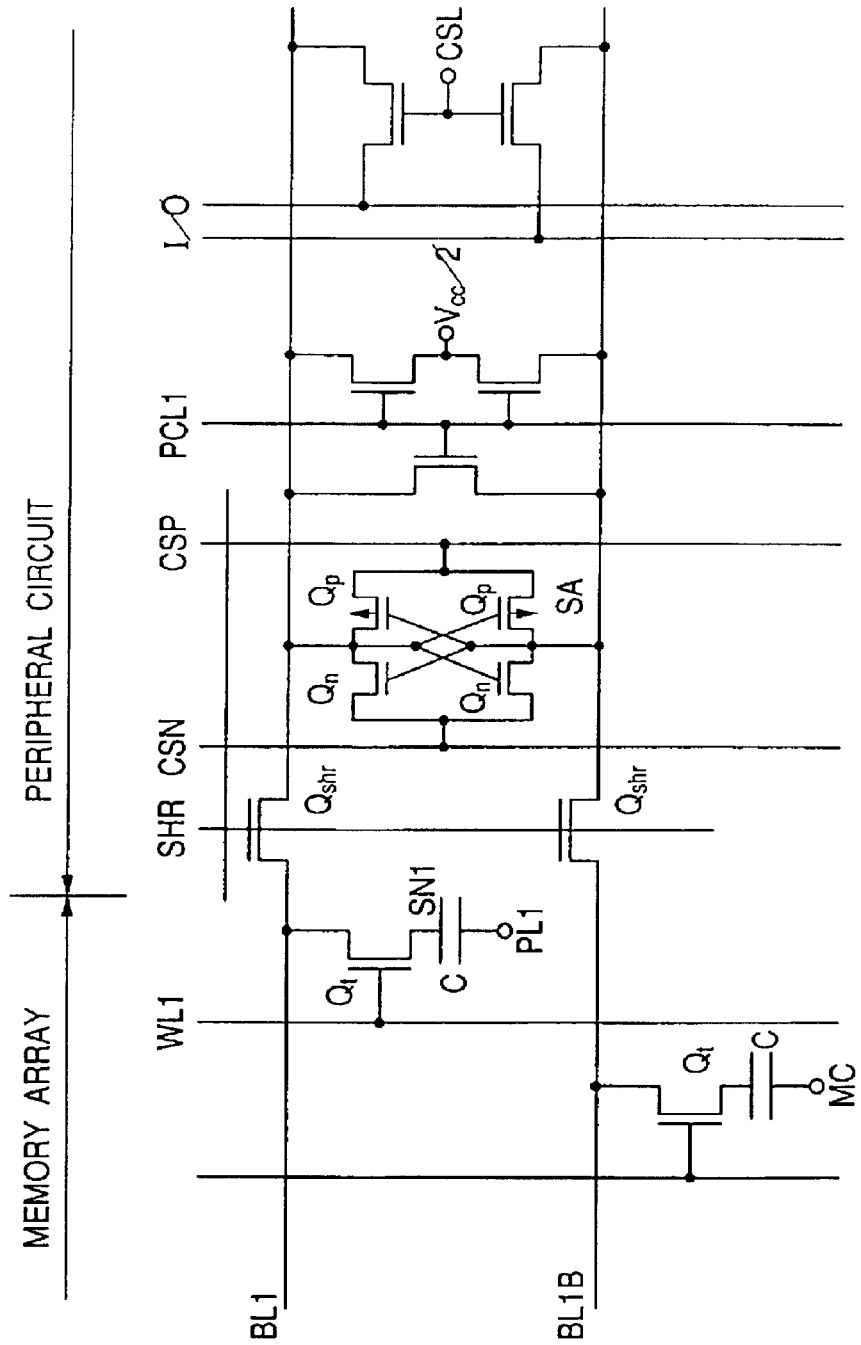
FIG. 14 is a circuit diagram showing respective portions of the memory cell and the peripheral circuit according to the present invention.

FIG. 12 is a sectional view showing essential portions of respective portions of a memory cell array portion and a peripheral circuit contiguous thereto. FIG. 13 is a plane view of respective portions of a memory cell according to the present invention and a peripheral circuit and FIG. 14 is a circuit diagram showing respective portions of the memory cell according to the present invention and the peripheral circuit. FIG. 12 is a sectional view taken along a line X—X' of FIG. 13. FIG. 12 shows MISFET, $Q_t$ for selecting a memory cell and MISFET of a peripheral circuit attached with notations $Q_{shr}$, $Q_p$ and $Q_n$ in FIG. 13 and FIG. 14. Notation $Q_{shr}$ designates shared MISFET for separating a memory cell portion of DRAM and a sense amplifier of a peripheral circuit portion. Notation $Q_p$ designates a p-channel MISFET, notation $Q_n$ designates an n-channel MISFET and a sense amplifier portion is constituted by a flip flop circuit comprising two of $Q_p$ and two of $Q_n$.

An explanation will be given of reading operation when a memory according to the present invention is used as DRAM in reference to the circuit diagram shown by FIG. 14. Potential of a plate electrode PL1 of a capacitor is always fixed to Vcc/2. In the meantime, at store node SN1 of capacitor, volatile information Vcc or 0 is held. Potential of a bit line pair BL1 and BL1B are held to Vcc/2 immediately before reading or rewriting operation. The bit line pair is connected with a sense amplifier SA for detecting an amplifying stored information. In order to detect store voltage of the store node SN1, potential of a precharge control line PCL1 is lowered from Vcc to 0 and a bit line is brought into a floating state having potential of Vcc/2. At the same time, the shared MISFET $Q_{shr}$ is made ON. Next, potential of a word line WL1 is elevated from 0 to Vch. In this case, Vch is potential higher than Vcc by at least threshold voltage of transistor. As a result, when the potential of the store node is Vcc, the potential of the bit line BL1 becomes slightly higher than the potential of BL1B, that is, Vcc/2, in the meantime, when it is 0, the potential of BL1 becomes slightly lower than that of BL1B. By detecting and amplifying the potential difference by the sense amplifier SA1, the potential of BL1 coincides with the potential of the store node to be Vcc or 0. The potential of BL1B becomes potential opposed to that of BL1. Further, in order to operate the sense amplifier, a p-channel transistor control line CSP for sense amplifier and an n-channel transistor control line CSN of sense amplifier may respectively be set to Vcc and 0. By the above operation, information of all of memory cells connected to the selected word line WL1 is read by respectively connected bit lines. In order to read information of one of the memory cells to outside selectively via an IO line, the potential of the sense amplifier selecting line CSL1 may be changed from 0 to Vch and the desired bit line may be connected to the IO line. In order to finish reading operation, when the potential of CSL1 is returned from Vch to 0 and thereafter, the word line WL1 is returned to 0, the store node SN1 is electrically separated from the bit line in a state in which information is rewritten. When PCL1 is returned to Vcc and CSP and CSN are returned to respectively 0 and Vcc, there is brought about a state before reading operation and the operation is finished.

Next, an explanation will be given of reading and writing procedure based on JP-A-7-21784 when the memory of the present invention is used as ferroelectric involatile memory.

First, the reading operation is the same as in the above-described case of DRAM.

In rewriting information in the ferroelectric involatile memory, polarization inversion of a ferroelectric film is carried out along with potential inversion of the store node SN1. The rewriting operation is the same as the reading operation until the signal line PCL1 is lowered from Vch to 0 and the sense amplifier is operated. Next, in order to write rewrite information prepared at the IO line to the memory cell, the signal line CSL1 is elevated from 0 to Vch. As a result, potentials of the bit line pair BL1 and BL1B is inverted. Since the word line WL1 is brought into an activated state, in accordance with potential inversion of the bit line, the store node potential of the desired memory cell and the polarization direction of the ferroelectric film are inverted. In this way, after rewriting information, the rewiring operation is finished by a procedure similar to that of the reading operation. According to the reading and writing procedure, volatile information and involatile information are rewritten always coincidently and therefore, even when power source is made OFF, the information does not vanish.

Next, an explanation will be given of operation of converting involatile information to volatile information when power source is made ON in the ferroelectric involatile memory. Before inputting power source, all potential is at 0V. In accordance with power source ON, the plate PL1 is initialized to Vcc/2 and the signal lines CSP and CSN of the sense amplifier are initialized to 0 and Vcc. Further, the potential of the signal line PCL rises from 0 to Vcc, as a result, the potential of the bit line pair BL1 and BL1B is precharged to Vcc/2. At this occasion, the potential of the word line maintains 0V and the store node SN1 is brought into a floating state such that the polarization direction of the ferroelectric film is not destructed when voltage of the plate is elevated. When potentials of the plate PL1 and the bit line pair BL1 and BL1B are firmly stabilized to potential of Vcc/2, the word lines WL are successively activated, the store node SN1 is set to potential of Vcc/2 the same as that of the plate PL1 to thereby further stabilize holding of polarization information. Successive to the above-described initializing operation, the operation shifts to operation of converting from involatile information to volatile information. First, the potential of PCL1 is set to 0V in a state in which all of the word lines are at 0V and the bit line is brought into a floating state. Next, the bit line is precharged to 0V and is again brought into the floating state. Thereafter, when the word line WL1 is activated, current flows from the store node SN1 to the bit line and the potential of the bit line is elevated. The amount of elevation is dependent on the polarization direction of the ferroelectric film. That is, even after elevating the potential of the bit line, the plate potential is higher and therefore, the polarization direction is aligned to one direction. Effective capacitance of the ferroelectric capacitor is larger in the case accompanied by inversion of polarization by activating the word line than a case not accompanied by the inversion, as a result, an amount of elevating the potential of the bit line is also larger. There is installed a dummy cell for producing an. intermediary value of the amount of elevating the potential of the bit line in correspondence with the two polarization states in the compensating bit line BL1B and the potential difference of the bit line pair BL1 and BL1B is detected and amplified by the sense amplifier SA1. By operating the sense amplifier, the bit line potential is charged to Vcc or 0, as a result, the store node SN1 is written with volatile information. Finally, word line is deactivated and thereafter, the bit line potential is returned to Vcc/2 to thereby finish a series of operation. When the above described operation is successively carried out for the respective word lines, the operation of converting from involatile information to volatile information is finished. According to the procedure, inversion of polarization of the ferroelectric film accompanied by information reading operation can be executed only when the power source is inputted and accordingly, deterioration of the ferroelectric film can be reduced. Further, there is no reduction in the reading speed caused by a time period required for the polarization inversion in the normal use. Further, information at time point when the power source is made OFF is stored and the information can be revived when the power source is successively made ON.

Although according to the above described embodiments, an explanation has been given by using a dielectric substance including lead as the ferroelectric material, in the case of material reacting with silicon oxide at the temperature of forming the ferroelectric film, the present invention is naturally applicable effectively. Especially in the case of material including bismuth, the present invention is particularly useful since violent reaction is caused as in the case of lead. That is, the preferably applicable dielectric material of the present invention is oxide dielectrics including an element selected from lead and bismuth. As materials corresponding thereto other than PZT shown in the above-described examples, there are lead titanate ($PbTiO_3$), lead barium zirconate titanate ($(Ba, Pb)(Zr, Ti)O_3$), barium lead niobate ($(Ba, Pb)Nb_2O_6$), strontium bismuth tantalite ($SrBi_2Ta_2O_9$), bismuth titanate ($Bi_4Ti_3O_{12}$) and barium strontium titanate zirconate $(Ba, Sr)(Zr, Ti)O_3$. The present invention is applicable to all of dielectric substance having these as basic structure. That is, it may be an oxide described in the form of $(A_1A_2 \ldots)(B_1B_2 \ldots)Ox$ ($A_1$=Pb, Bi; $A_2$=Ca, Sr, Cd, Ba, La, Tl, Na, K; $B_1,B_2 \ldots$ =Ta, Ti, Zr, Hf, Fe, Nb, Sn, U, Al, Mn, W, Yb, Sc, U. In, Sb, Co, Zn, Li, Mo, Ni, Co). Further, the present invention includes a case in which other elements are mixed with a material having major components of these.

Although as the reaction barrier layer, the titanium dioxide film is used in the above-described embodiments, effective is a film having a major component of an oxide of elements selected from the above-described elements as $B_1$ and $B_2$, that is, Ta, Ti, Zr, Hf, Fe, Nb, Sn, U, Al, Mn, W, Yb, Sc, U, In, Sb, Co, Zn, Li, Mo Ni and Co. Particularly, titanium oxide, aluminum or bismuth silicate is effective.

Although according to the above-described embodiments, platinum is used as material of electrode, the electrode material can be implemented even with metals having major components of metals selected from Ru, Ir, Pd, Ni and Pt and alloys of these or oxides of elements selected from V, Cr, Fe, Ru, In, Sn, Re, Ir, Pt, Cu and Pd.

Further, a diffusion barrier conductive layer may use the material selected from Ti, Ta, TiN, $Al_xTi_{1-x}N$ and WN or a plurality thereof by laminating them.

Although according to the embodiments, as a process of forming the reaction barrier layer, a sputtering process and thermal oxidation of a metal thin film are shown, other than a reactive sputtering in an oxygen including atmosphere, a thin film formed by a CVD process, a sol/gel coating process is also applicable.

According to the present invention, even when a dielectric substance including lead is used as a capacitor insulating film, reaction with an interlayer insulating film or a diffusion barrier layer can be restrained and therefore, a highly integrated semiconductor storage device can be realized.

What is claimed is:

1. A semiconductor device comprising:

an insulating film formed on a substrate provided with a transistor and having an opening portion;

a conductive film formed in the opening portion; and a capacitor formed on the conductive film and comprising a first electrode, a ferroelectric film and a second electrode;

wherein the ferroelectric film includes at least one element selected from the group consisting of lead, barium and bismuth and formed from above the first electrode to above the insulating film;

wherein a reaction barrier film is provided between the insulating film and the ferroelectric film to prevent a reaction between the insulating film and the ferroelectric film, said reaction barrier film being in contact with a lower surface of said first electrode such that the reaction barrier film is interposed between the lower surface of the first electrode and said insulating film;

wherein a diffusion barrier film is provided between the conductive film and the first electrode and side faces of the diffusion barrier are not brought into contact with the ferroelectric film;

wherein an upper surface of said diffusion barrier film and an upper surface of said reaction barrier film are substantially on a same plane and thicknesses of said diffusion barrier film and said reaction barrier film are substantially the same; and wherein side faces of the first electrode are provided to be brought into contact with the ferroelectric film.

2. The semiconductor device according to claim 1:

wherein the ferroelectric film comprises any of the group consisting of lead titanate zirconate, lead titanate, barium lead titanate zirconate, barium lead niobate, strontium bismuth tantalite, bismuth titanate and barium strontium titanate zirconate.

3. The semiconductor device according to claim 1:

wherein the reaction barrier layer comprises any of the group consisting of titanium oxide, alumina and bismuth silicate.

4. The semiconductor device according to claim 1:

wherein the diffusion barrier film is a film comprising any of or laminated with any of the group consisting of Ti, Ta, TiN, $Al_xTi_{1-x}N$ and WN.

5. A semiconductor device comprising:

a substrate provided with a transistor;

an insulating film formed on the substrate and having an opening portion;

a conductive film formed in the opening portion; and a capacitor formed on the conductive film and comprising a first electrode; a ferroelectrics film and a second electrode;

wherein the ferroelectric film includes at least one element selected from the group consisting of lead, barium and bismuth and formed on an upper face and side faces of the first electrode and on the insulating film;

wherein a reaction barrier film is provided between the insulating film and the ferroelectric film to prevent a reaction between the insulating film and the ferroelectric film, said reaction barrier film being in contact with a lower surface of said first electrode such that the reaction barrier film is interposed between the lower surface of the first electrode and said insulating film;

wherein a diffusion barrier film is provided between the conductive film and the first electrode and in the opening portion of the reaction barrier film; and wherein an upper surface of said diffusion barrier film and an upper surface of said reaction barrier film are substantially on a same plane and thicknesses of said diffusion barrier film and said reaction barrier film are substantially the same.

6. The semiconductor device according to claim 5:

wherein side faces of the diffusion barrier film are not brought into contact with the ferroelectric film.

7. The semiconductor device according to claim 5:

wherein the ferroelectric film comprises any of the group consisting of lead titanate zirconate, lead titanate, barium lead titanate zirconate, barium lead niobate, strontium bismuth tantalite, bismuth titanate and barium strontium titanate zirconate.

8. The semiconductor device according to claim 5:

wherein the reaction barrier layer comprises any of the group consisting of titanium oxide, alumina and bismuth silicate.

9. The semiconductor device according to claim 5:

wherein the diffusion barrier film is a film comprising any of or laminated with any of the group consisting of Ti, Ta, TiN, $Al_xTi_{1-x}N$ and WN.

10. A semiconductor device comprising:

an insulating film formed on a substrate provided with a transistor and having an opening portion;

a conductive film formed in the opening portion;

a capacitor formed on the conductive film and comprising a first electrode, a ferroelectric film and a second electrode, wherein the ferroelectric film includes at least one element selected from the group consisting of lead, barium and bismuth and formed from above the first electrode to above the insulating film; and means for preventing a reaction between the insulating film and the ferroelectric film, said means for preventing a reaction being in contact with a lower surface of said first electrode such that the means for preventing a reaction is interposed between the lower surface of the first electrode and said insulating film;

wherein a diffusion barrier film is provided between the conductive film and the first electrode and side faces of the diffusion barrier are not brought into contact with the ferroelectric film;

wherein an upper surface of said diffusion barrier film and an upper surface of said means for preventing a reaction are substantially on a same plane and thicknesses of said diffusion barrier film and said means for preventing a reaction are substantially the same; and wherein side faces of the first electrode are provided to be brought into contact with the ferroelectric film.

11. A semiconductor device according to claim 10, wherein said means for preventing a reaction comprises a $TiO_2$ film.

12. A semiconductor device comprising:

a substrate provided with a transistor;

an insulating film formed on the substrate and having an opening portion;

a conductive film formed in the opening portion, a capacitor formed on the conductive film and comprising a first electrode; a ferroelectric film and a second electrode, wherein the ferroelectric film includes at least one element selected from the group consisting of lead, barium and bismuth and formed on an upper face and side faces of the first electrode and on the insulating film; and means for preventing a reaction between the insulating film and the ferroelectric film, said means for preventing a reaction being in contact with a lower surface of said first electrode such that the means for preventing a reaction is interposed between the lower surface of the first electrode and said insulating film;

wherein a diffusion barrier film is provided between the conductive film and the first electrode and in the opening portion of the means for preventing a reaction; and wherein an upper surface of said diffusion barrier film and an upper surface of said means for preventing a reaction are substantially on a same plane and thicknesses of said diffusion barrier film and said means for preventing a reaction are substantially the same.

13. A semiconductor device according to claim 12, wherein said means for preventing a reaction comprises a $TiO_2$ film.

14. A semiconductor device comprising:
- an insulating film formed on a substrate provided with a transistor and having an open portion which has a wider area at an upper portion thereof and a narrow area at a lower portion thereof;
- a tapered conductive film formed in the opening portion to have a wide area at a surface adjacent the upper portion of the opening portion and a narrow area adjacent the lower portion of the opening portion; and
- a capacitor formed on the conductive film and comprising a first electrode, a ferroelectric film and a second electrode;
- wherein the ferroelectric film includes at least one element selected from the group consisting of lead, barium and bismuth and formed from above the first electrode to above the insulating film;
- wherein a reaction barrier film is provided between the insulating film and the ferroelectric film, said reaction barrier film being in contact with a lower surface of the first electrode such that the reaction barrier film is interposed between the lower surface of the first electrode and said insulating film;
- wherein a diffusion barrier film is provided between the conductive film and the first electrode and side faces of the diffusion barrier are not brought into contact with the ferroelectric film;
- wherein a distance from a first electrode edge to a diffusion barrier edge is larger than the width of a word line coupled to said transistor;
- wherein an upper surface of said diffusion barrier film and an upper surface of said reaction barrier film are substantially on a same plane; and
- wherein side faces of the first electrode are provided to be brought into contact with the ferroelectric film.

15. The semiconductor device according to claim 14, wherein the ferroelectric film comprises any of the group consisting of lead titanate zirconate, lead titanate, barium lead titanate zirconate, barium lead niobate, strontium bismuth tantalite, bismuth titanate and barium strontium titanate zirconate.

16. The semiconductor device according to claim 14, wherein the reaction barrier layer comprises any of the group consisting of titanium oxide, alumina and bismuth silicate.

17. The semiconductor device according to claim 14, wherein the diffusion barrier film is a film comprising any of or laminated with any of the group consisting of Ti, Ta, TiN, AlxTi1-xN and WN.

18. A semiconductor device comprising:
- a substrate provided with a transistor;
- an insulating film formed on the substrate and having an opening portion which has a wider area at an upper portion thereof and a narrow area of a lower portion thereof;
- a tapered conductive film formed in the opening portion to have a wide area at a surface adjacent the upper portion of the opening portion and a narrow area adjacent the lower portion of the opening portion; and
- a capacitor formed on the conductive film and comprising a first electrode, a ferroelectric film and a second electrode;
- wherein the ferroelectric film includes at least one element selected from the group consisting of lead, barium and bismuth and formed on an upper face and side faces of the first electrode and on the insulating film;
- wherein a reaction barrier film is provided between the insulating film and the ferroelectric film said reaction barrier film being in contact with a lower surface of said first electrode such that the reaction barrier film is interposed between the lower surface of the first electrode and said insulating film;
- wherein a diffusion barrier film is provided between the conductive film and the first electrode and in the opening portion of the reaction barrier film;
- wherein a distance from a first electrode edge to a diffusion barrier edge is larger than the width of a word line coupled to said transistor; and
- wherein an upper surface of said diffusion barrier film and an upper surface of said reaction barrier film are substantially on a same plane.

19. The semiconductor device according to claim 18, wherein side faces of the diffusion barrier film are not brought into contact with the ferroelectric film.

20. The semiconductor device according to claim 18, wherein the ferroelectric film comprises any of the group consisting of lead titanate zirconate, lead titanate, barium lead titanate zirconate, barium lead niobate, strontium bismuth tantalite, bismuth titanate and barium strontium titanate zirconate.

21. The semiconductor device according to claim 18, wherein the reaction barrier layer comprises any of the group consisting of titanium oxide, alumina and bismuth silicate.

22. The semiconductor device according to claim 18, wherein the diffusion barrier film is a film comprising any of or laminated with any of the group consisting of Ti, Ta, TiN, AlxTi1-xN and WN.

23. A semiconductor device comprising:
- an insulating film formed on a substrate provided with a transistor and having an opening portion which has a wider area at an upper portion thereof and a narrow area of a lower portion thereof;
- a tapered conductive film formed in the opening portion to have a wide area at a surface adjacent the upper portion of the opening portion and a narrow area adjacent the lower portion of the opening portion;
- a capacitor formed on the conductive film and comprising a first electrode, a ferroelectric film and a second electrode,
- wherein the ferroelectric film includes at least one element selected from the group consisting of lead, barium and bismuth and formed from above the first electrode to above the insulating film; and
- means for preventing a reaction between the insulating film and the ferroelectric film,
- said means for preventing a reaction is in contact with a lower surface of said first electrode such that the means for preventing a reaction is interposed between the lower surface of the first electrode and said insulating film;
- wherein a diffusion barrier film is provided between the conductive film and the first electrode and side faces of the diffusion barrier are not brought into contact with the ferroelectric film;
- wherein a distance from a first electrode edge to a diffusion barrier edge is larger than the width of a word line coupled to said transistor;

wherein an upper surface of said diffusion barrier film and an upper surface of said means for preventing a reaction are substantially on a same plane; and wherein side faces of the first electrode are provided to be brought into contact with the ferroelectric film.

24. A semiconductor device according to claim 23, wherein said means for preventing a reaction comprises a TiO2 film.

25. A semiconductor device comprising:

a substrate provided with a transistor;

an insulating film formed on the substrate and having an opening portion which has a wider area of an upper portion thereof and a narrow area of a lower portion thereof;

a tapered conductive film formed in the opening portion to have a wide area at a surface adjacent the upper portion of the opening portion and a narrow area adjacent the lower portion of the opening portion;

a capacitor formed on the conductive film and comprising a first electrode, a ferroelectric film and a second electrode, wherein the ferroelectric film includes at least one element selected from the group consisting of lead, barium and bismuth and formed on an upper face and side faces of the first electrode and on the insulating film; and means for preventing a reaction between the insulating film and the ferroelectric film, wherein said means for preventing a reaction is in contact with a lower surface of said first electrode such that the means for preventing a reaction is interposed between the lower surface of the first electrode and said insulating film;

wherein a diffusion barrier film is provided between the conductive film and the first electrode and in the opening portion of the means for preventing a reaction;

wherein a distance from a first electrode edge to a diffusion barrier edge is larger than a width of a word line coupled to said transistor; and wherein an upper surface of said diffusion barrier film and an upper surface of said means for preventing a reaction are substantially on a same plane.

26. A semiconductor device according to claim 25, wherein said means for preventing a reaction comprises a TiO2 film.

* * * * *